(12) United States Patent
Signer et al.

(10) Patent No.: US 7,576,977 B2
(45) Date of Patent: Aug. 18, 2009

(54) SHOULDER SCREW AND HANDLE DRIVE MOUNTING SYSTEM

(75) Inventors: Ryan Signer, Derby, KS (US); Robert Harvey, Wichita, KS (US); John Dunham, Kechi, KS (US)

(73) Assignee: LSI Logic Corporation, Milpitas, CA (US)

( * ) Notice: Subject to any disclaimer, the term of this patent is extended or adjusted under 35 U.S.C. 154(b) by 158 days.

(21) Appl. No.: 11/903,640

(22) Filed: Sep. 24, 2007

(65) Prior Publication Data

US 2009/0103258 A1    Apr. 23, 2009

(51) Int. Cl.
*G06F 1/16* (2006.01)
(52) U.S. Cl. .................................... 361/679.33; 211/26
(58) Field of Classification Search ......... 361/679.33–679.36; 211/26
See application file for complete search history.

(56) References Cited

U.S. PATENT DOCUMENTS

| 6,377,449 | B1* | 4/2002 | Liao et al. | 361/679.33 |
| 6,625,014 | B1* | 9/2003 | Tucker et al. | 361/679.34 |
| 6,956,737 | B2* | 10/2005 | Chen et al. | 361/679.39 |
| 2007/0014085 | A1* | 1/2007 | Meserth et al. | 361/685 |

* cited by examiner

*Primary Examiner*—Lisa Lea-Edmonds
(74) *Attorney, Agent, or Firm*—Suiter Swantz pc llo

(57) ABSTRACT

A computer storage enclosure may comprise a mounting chassis and a computer drive apparatus. The mounting chassis may have a plurality of computer drive guides, a plurality of cam pins, and a mounting chassis disengagement ramp. The computer drive apparatus may include a computer drive, a plurality of shoulder screws, and a computer drive handle. The computer drive apparatus may be mounted on the mounting chassis utilizing the shoulder screws guided by the computer drive guides and secured by the computer drive handle, the cam pins, and the shoulder screws. The computer drive apparatus may include a blade drive and be hot-swappable.

20 Claims, 3 Drawing Sheets

SHOULDER SCREW AND HANDLE DRIVE MOUNTING SYSTEM

TECHNICAL FIELD

The present disclosure generally relates to the field of computer systems and configurations, and particularly to a computer drive mounting system for data storage systems.

BACKGROUND

Many computer storage enclosures, such as a blade server, utilize multiple drives and removable components. A blade server is essentially a housing for a number of individual minimally-packaged computer motherboard "blades," each including one or more processors, memory, storage, and network connections, but sharing the common power supply and air-cooling resources of the chassis. Blade servers have many components removed for space and power consideration while still being functional as a computer. Blade servers allow more processing power in less rack space, simplifying cabling and reducing power consumption. Often, computer drives, such as blades, are hot-swappable and may be removed without affecting computer operation while the computer is still operating.

SUMMARY

A computer drive apparatus may comprise a computer drive, a plurality of shoulder screws, and a computer drive handle. A portion of the plurality of shoulder screws are mounted to a first drive side and a portion of the plurality of shoulder screws are mounted to a second drive side of the computer drive. The first drive side may be oppositely disposed to the second drive side. The computer drive handle may be attached to the computer drive by at least a first shoulder screw disposed on the first drive side and at least a second shoulder screw disposed on the second drive side. The plurality of shoulder screws may guide the computer drive into a mounting chassis. The computer drive handle may be rotatable over a plurality of cam pins guided by corresponding cam pin guides disposed on the mounting chassis for securing the computer drive in the mounting chassis.

A server system and/or a computer storage enclosure may comprise a mounting chassis and a computer drive apparatus. The mounting chassis may have a plurality of computer drive guides, a plurality of cam pins, and a mounting chassis disengagement ramp. The computer drive apparatus may include a computer drive, a plurality of shoulder screws, and a computer drive handle. The computer drive apparatus may be mounted on the mounting chassis utilizing the shoulder screws guided by the computer drive guides and secured by the computer drive handle, the cam pins, and the shoulder screws. The computer drive apparatus may be hot-swappable.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Figure 1:
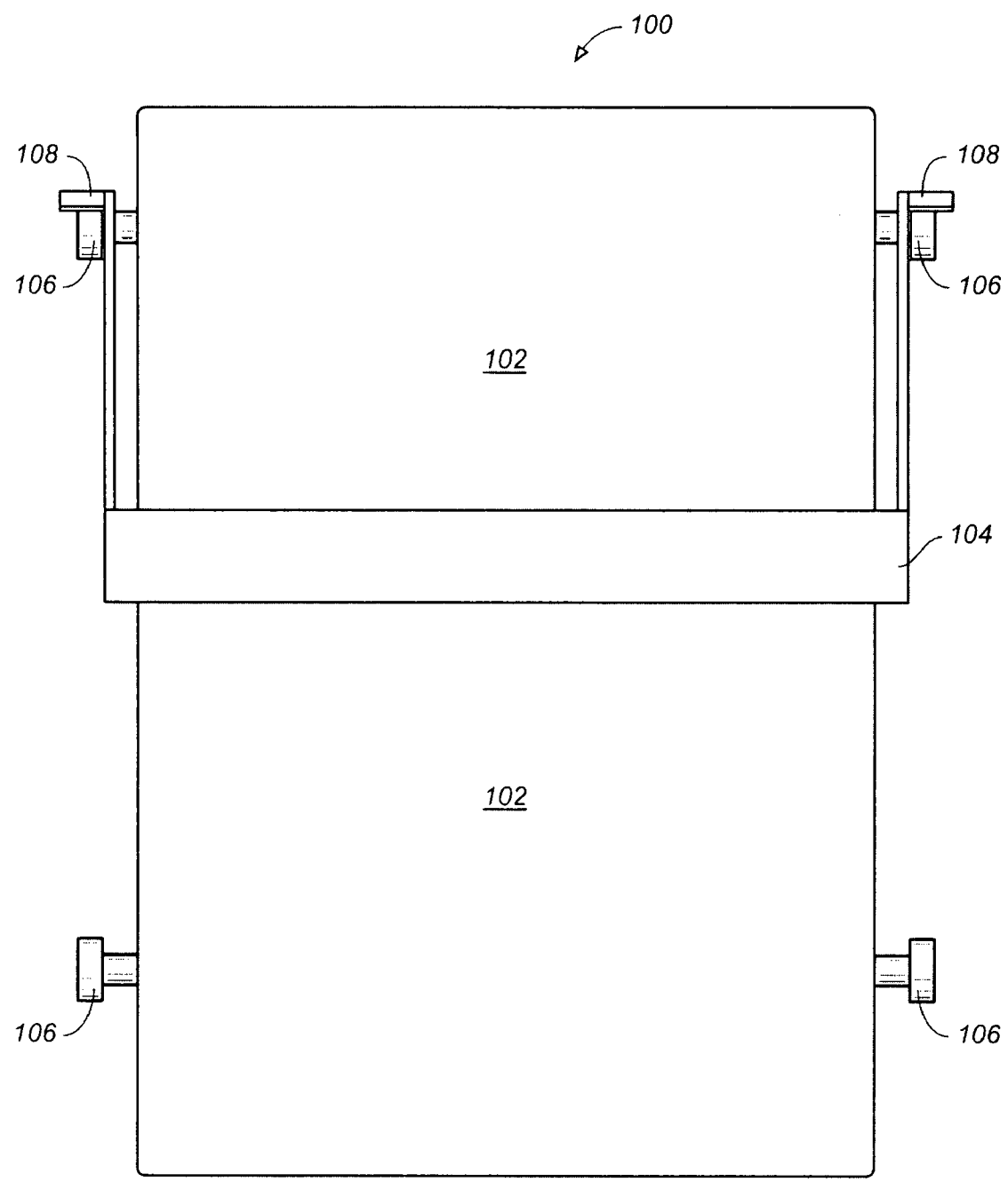
FIG. 1 is a side elevational view illustrating a vertical computer drive.
Figure 2:
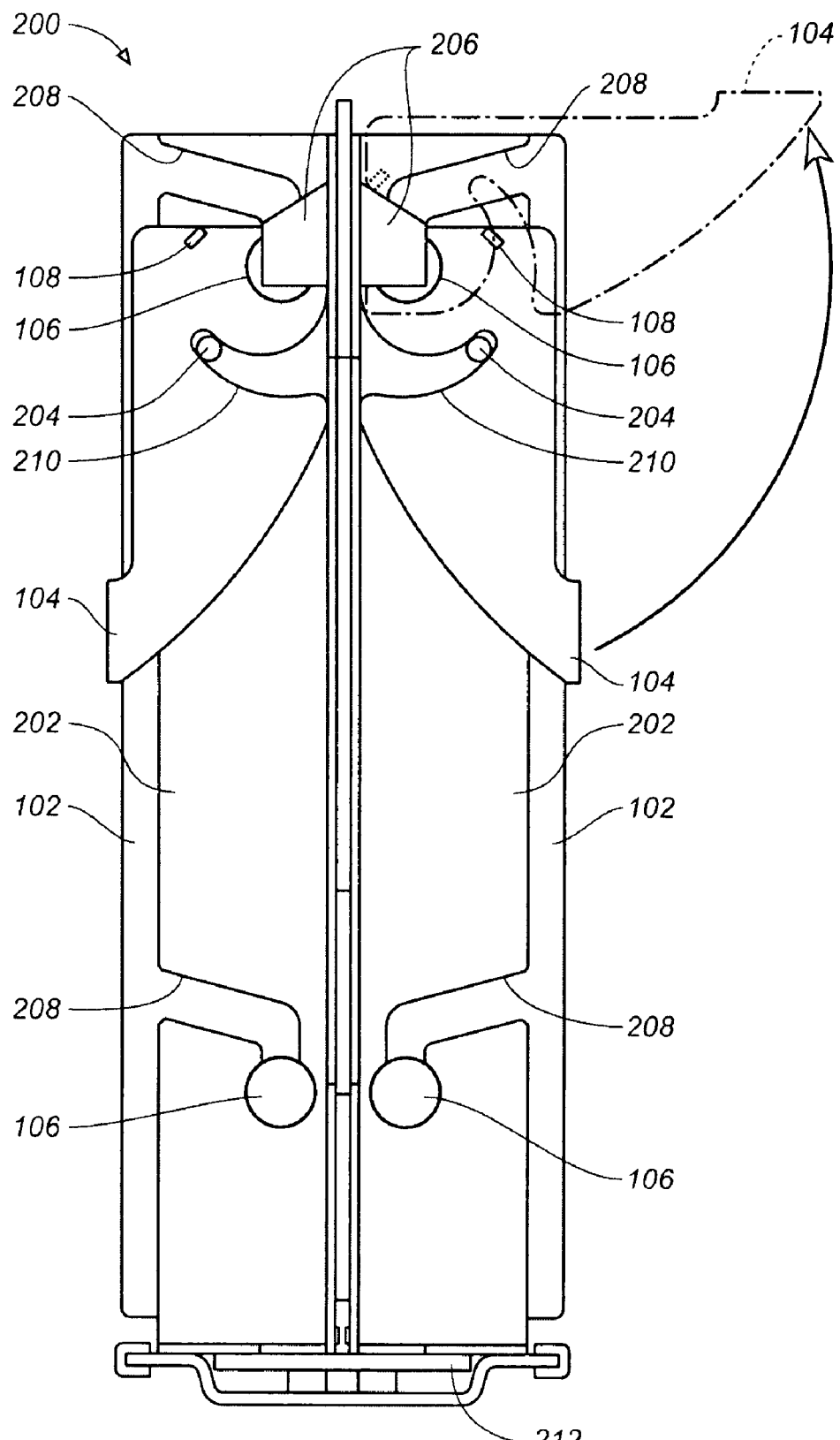
FIG. 2 is a side elevational view of the vertical computer drive in FIG. 1, wherein the vertical computer drive is mounted in a mounting chassis.
Figure 3:
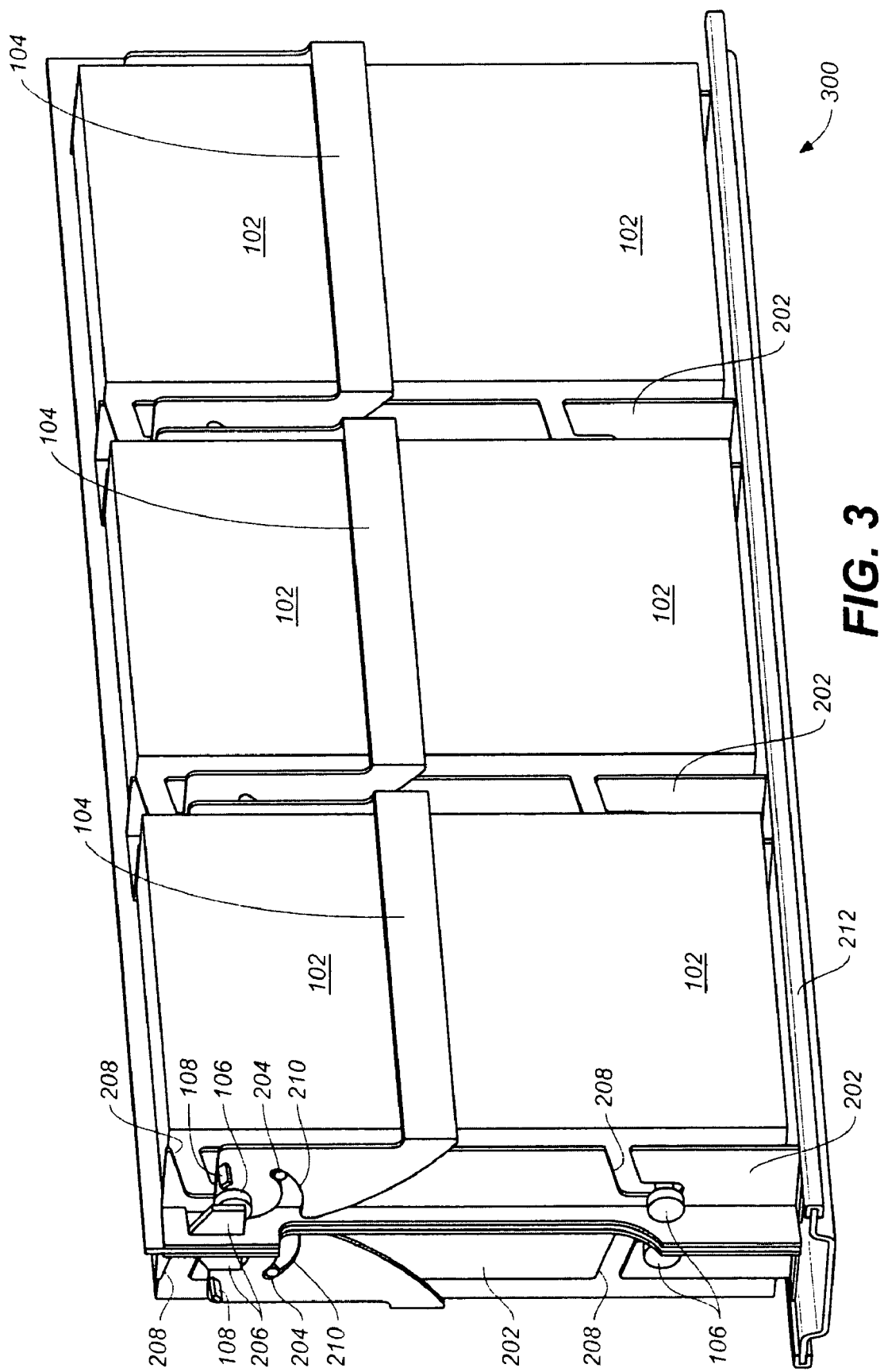
FIG. 3 is an isometric view illustrating a computer storage enclosure, wherein the computer storage enclosure includes a series of computer drives mounted in corresponding mounting chassis.

Referring generally to FIGS. 1 through 3, a computer drive apparatus 100 and a computer server system 200 utilizing a computer drive handle 104 and shoulder screws 106 are described. The computer server system 200 may comprise a mounting chassis 202, a computer drive apparatus 100 and a chassis backplane 212.

The computer drive apparatus 100 may include a computer drive 102, a plurality of shoulder screws 106, and a computer drive handle 104. The computer drive 102 may be rectangular or square in shape. A plurality of shoulder screws 106 may be mounted to the computer drive 102. The shoulder screws may be mounted to a first side and a second side of the computer drive 102. A portion of the shoulder screws 106 may function solely as guides for directing the computer drive 102 into a mounting chassis, discussed in more detail below. A second portion of the shoulder screws 106 may function as guides for directing the computer drive 102 into a mounting chassis and simultaneously as fasteners for a computer drive handle 104.

The computer drive apparatus 100 and the computer drive 102 may include a blade drive for utilization in a blade server system. A blade server may include a housing for a number of individual minimally-packaged computer motherboard "blades," or blade drives, each including one or more processors, memory, storage, and network connections, but sharing the common power supply and air-cooling resources of the chassis. The blade drive may be hot-swappable and have the ability to be removed from the chassis while operating without affecting the overall operation of the blade server. A blade server may include a density of one hundred blade drives per computer storage enclosure 300 or more. A computer storage enclosure may include a blade server, a redundant array of independent drives (RAID), a disk array, a computer case, and universal server racks, as well as other types of computer storage enclosures known in the art.

The computer drive handle 104 may be fastened to a first side and an opposing second side of the computer drive 102 by a plurality of shoulder screws 106. This may allow the computer drive handle 104 to pivot around the shoulder screws 106 fastening the computer drive handle 104 and away from the computer drive 102 or toward the computer drive 102. When the computer drive handle 104 is pivoted away from the computer drive 102, greater leverage may be provided for removing the computer drive 102 from the computer storage enclosure 300 and the mounting chassis 202.

Additionally, the computer drive handle 104 may include a computer drive handle tab 108 for assisting in removal of the computer drive 102 from the computer storage enclosure 300 and the mounting chassis 202. The computer drive handle tab 108 may extend from the computer drive handle 104 near the portion of the computer drive handle 104 fastened to the computer drive 102 by the shoulder screws 106. When the computer drive handle 104 is pivoted away from the computer drive 102, the computer drive handle tab 108 may contact a mounting chassis disengagement ramp 206 and provide a lifting motion for disengaging the computer drive 102 from the computer storage enclosure 300 and the mounting chassis 202. Additionally, the motion provided by the computer drive handle tab 108 while contacting and pushing against the mounting chassis disengagement ramp 206 may assist with directing the shoulder screws 106 mounted to the computer drive 102 along a path defined by computer drive guides 208. The computer drive handle 104 may include one or multiple computer drive handle tabs 108.

Further, the computer drive handle 104 may include a plurality of cam pin guides 210. The cam pin guides 210 may provide a path for a plurality of corresponding cam pins 204 that may be disposed on the mounting chassis 202. When a computer drive 102 is positioned in the mounting chassis 202 and on a chassis backplane 212, the computer drive handle 104 may be pivoted toward the computer drive 102 from an open position to a closed position, providing a caming action in which the computer drive 102 may be secured in place. A chassis backplane 212, as referred to herein, may mean the board with connectors and/or the guide system (which is attached to the sheetmetal base, which is attached to the board). Because the cam pins 204 may be adjacent and/or touching the computer drive handle 104 when the computer drive handle 104 is in a closed position, the cam pins 204 may act to secure the computer drive 102 in place and prevent movement of the computer drive 102 from the mounting chassis 202. Additionally, the computer drive handle 104 may include a latch mechanism for locking the computer drive handle 104 in place and securing the computer drive 102.

The mounting chassis 202 may include multiple walls between which a computer drive 102 may be placed. The wall of the mounting chassis 202 may be connected on one edge to a chassis backplane 212. A second edge of the wall of the mounting chassis 202 may be connected to a separate support, or a back support, against which the side of the computer drive 102 opposite the computer drive handle 104 may face. The walls of the mounting chassis 202 may include computer drive guides 208, which may provide a path for the shoulder screws 106 and the computer drive 102 while being inserted into the mounting chassis 202 for connection to the chassis backplane 212 and the computer server system 200.

A mounting chassis disengagement ramp 206 may be disposed on the back support against which a side of the computer drive 102 opposite the computer drive handle 104 faces. The mounting chassis disengagement ramp 206 may provide a surface on which the computer drive handle tab 108 contacts and pushes upon when the computer drive handle 104 is lifted to an open position away from the computer drive 102. The movement of the computer drive handle tab 108 against the mounting chassis disengagement ramp 206 may transfer lift to the computer drive 102 for disengaging the computer drive 102 from the mounting chassis 202 and the chassis backplane 212.

The above described shoulder screw and handle drive mounting system is advantageous because it offers a simple and low-profile drive mounting system. The overall price for this system is inexpensive compared to other removable drive options. Additionally, utilizing this mounting system allows a lower height of the overall system and results in a greater density of drives per computer storage enclosure. Additionally, the caming action of the computer drive handle and the cam pins allow for the computer drive to be more securely positioned in the mounting chassis.

It is believed that the shoulder screw and handle mounting system of the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

What is claimed is:

1. A computer drive apparatus, comprising:
    a computer drive;
    a plurality of shoulder screws, a portion of the plurality of shoulder screws mounted to a first drive side and a portion of the plurality of shoulder screws mounted to a second drive side of the computer drive, the first drive side oppositely disposed to the second drive side; and
    a computer drive handle, the drive handle being attached to the computer drive by at least a first shoulder screw disposed on the first drive side and at least a second shoulder screw disposed on the second drive side;
    wherein the plurality of shoulder screws guide the computer drive into a mounting chassis and the computer drive handle is rotatable over a plurality of cam pins, guided by corresponding cam pin guides, disposed on the mounting chassis for securing the computer drive in the mounting chassis.

2. The computer drive apparatus in claim 1, wherein the computer drive is a blade drive.

3. The computer drive apparatus in claim 2, wherein the blade drive is hot-swappable.

4. The computer drive apparatus in claim 1, wherein the drive handle is spring-loaded.

5. The computer drive apparatus in claim 1, wherein the drive handle includes a locking mechanism when in a secured position.

6. The computer drive apparatus in claim 1, wherein the computer drive includes two shoulder screws on the first drive side and two shoulder screws on the second drive side.

7. The computer drive apparatus in claim 1, wherein the drive handle includes two cam pin guides.

8. A server system, comprising:
    a mounting chassis, the mounting chassis comprising a plurality of computer drive guides, a plurality of cam pins disposed on the mounting chassis, and a mounting chassis disengagement ramp; and
    a computer drive apparatus, the computer drive apparatus comprising a computer drive, a plurality of shoulder screws, and a computer drive handle;
    wherein the computer drive apparatus is mounted on the mounting chassis utilizing the shoulder screws guided by the computer drive guides and secured by the computer drive handle, the cam pins, and the shoulder screws, and the computer drive apparatus is hot-swappable.

9. The server system in claim 8, wherein the server system is a blade server system.

10. The server system in claim 8, wherein the computer drive is a blade drive.

11. The server system in claim 10, wherein the blade drive is hot-swappable.

12. The server system in claim 8, wherein the drive handle is spring-loaded.

13. The computer drive apparatus in claim 8, wherein the drive handle includes a locking mechanism when in a secured position.

14. The computer drive apparatus in claim 8, wherein the computer drive includes two shoulder screws on the first drive side and two shoulder screws on the second drive side.

15. The computer drive apparatus in claim 8, wherein the drive handle includes two cam pin guides.

16. A storage enclosure, comprising:
   a mounting chassis, the mounting chassis comprising a plurality of computer drive guides, a plurality of cam pins disposed, and a mounting chassis disengagement ramp; and
   a computer drive apparatus, the computer drive apparatus comprising a computer drive, a plurality of shoulder screws, and a computer drive handle;
   wherein the computer drive apparatus is mounted on the mounting chassis utilizing the shoulder screws guided by the computer drive guides and secured by the computer drive handle, the cam pins, and the shoulder screws, and the computer drive apparatus is hot-swappable.

17. The storage enclosure in claim 16, wherein the storage enclosure includes at least one of a blade server, a redundant array of independent drives, and a disk array.

18. The storage enclosure in claim 16, wherein the drive handle includes a locking mechanism when in a secured position.

19. The storage enclosure in claim 16, wherein the computer drive includes two shoulder screws on the first drive side and two shoulder screws on the second drive side.

20. The storage enclosure in claim 16, wherein the drive handle includes two cam pin guides.

* * * * *